United States Patent
Imai

(10) Patent No.: US 6,749,763 B1
(45) Date of Patent: Jun. 15, 2004

(54) PLASMA PROCESSING METHOD

(75) Inventor: Shinichi Imai, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/630,680

(22) Filed: Aug. 1, 2000

(30) Foreign Application Priority Data

Aug. 2, 1999 (JP) .......................................... 11-218631

(51) Int. Cl.$^7$ .............................................. H01L 21/00
(52) U.S. Cl. ............................ 216/59; 216/79; 216/80; 438/14; 438/723
(58) Field of Search .......................... 216/59, 79, 80; 438/14, 723

(56) References Cited

U.S. PATENT DOCUMENTS

| | | | | |
|---|---|---|---|---|
| 3,908,041 A | * | 9/1975 | Engl et al. .................. 427/101 |
| 4,283,249 A | * | 8/1981 | Ephrath ...................... 156/345 |
| 4,826,564 A | * | 5/1989 | Desilets et al. ............... 216/49 |
| 5,244,730 A | * | 9/1993 | Nguyen et al. ............. 427/490 |
| 5,338,399 A | * | 8/1994 | Yanagida ..................... 216/67 |
| 5,501,893 A | * | 3/1996 | Laermer et al. .............. 216/67 |
| 5,595,627 A | * | 1/1997 | Inazawa et al. .............. 216/67 |
| 5,770,098 A | | 6/1998 | Araki et al. ................... 216/67 |
| 5,928,963 A | * | 7/1999 | Koshiishi ..................... 216/67 |
| 6,184,572 B1 | * | 2/2001 | Mountsier et al. .......... 257/632 |
| 6,297,163 B1 | * | 10/2001 | Zhu et al. ................... 438/707 |

FOREIGN PATENT DOCUMENTS

| | | |
|---|---|---|
| JP | 05-259119 | 10/1993 |
| JP | 06-338479 | 12/1994 |
| JP | 07-297173 | 11/1995 |
| JP | 08-250479 | 9/1996 |
| JP | 10-98024 | 4/1998 |
| JP | 10-134996 | 5/1998 |
| JP | 10-330970 | 12/1998 |
| JP | 11-100680 | 4/1999 |
| JP | 11-219942 | 8/1999 |
| JP | 11-243082 | 9/1999 |
| JP | 2000-173993 | 6/2000 |

* cited by examiner

*Primary Examiner*—Nadine G. Norton
*Assistant Examiner*—Shamim Ahmed
(74) *Attorney, Agent, or Firm*—Nixon Peabody LLP; Donald R. Studebaker

(57) ABSTRACT

A semiconductor substrate, on which a silicon dioxide film with a resist film defined thereon has been formed, is placed inside a reaction chamber of a plasma processing system. Then, a fluorocarbon gas with a C/F ratio of 0.5 or more is introduced into the reaction chamber. In this process step, the flow rate of the gas is controlled such that the residence time τ of the gas in the reaction chamber becomes greater than 0.1 sec and equal to or less than 1 sec in accordance with an equation τ=P×V/Q, where τ is the residence time (unit: sec), P is a pressure (unit: Pa) of the gas, V is a volume (unit: L) of the reaction chamber and Q is the flow rate (unit: Pa·L/sec) of the gas. Thereafter, plasma is created from the fluorocarbon gas and the silicon dioxide film is plasma-etched using the resist film as a mask.

8 Claims, 9 Drawing Sheets

PLASMA PROCESSING METHOD

BACKGROUND OF THE INVENTION

The present invention relates to a plasma processing method for use in a fabrication process of semiconductor devices, and more particularly relates to a plasma processing method, by which an etching or deposition process is carried out using plasma created from fluorocarbon gas.

In recent years, downsizing of semiconductor devices has accelerated so much that the required pattern definition is on the verge of reaching the 0.1 μm order at last.

However, the fabrication process of semiconductor devices is basically no different from what it used to be. That is to say, first, a thin film is deposited on a semiconductor substrate. Next, a resist film (i.e., an organic film) is defined on the thin film by a photolithographic process. And then the thin film is etched using the resist film.

Nevertheless, the type of exposing radiation, typically adopted in a lithographic process, has lately changed from line into KrF or ArF excimer laser radiation to cope with the accelerating downsizing trend of semiconductor devices. In addition, organic resist films have also been developed responsive to the change of exposing radiation.

The application of the ArF excimer laser radiation as exposing radiation to the 0.1 μm-order patterning is now under research and development. However, it is known that an organic resist film would be poorly resistant to an etching process in that case.

Thus, to ensure a high selectivity with respect to the resist film, various techniques have been proposed. For example, a technique takes advantage of a property of a silicon material as a fluorine scavenger by making a member inside a reaction chamber out of the silicon material. That is to say, according to the technique, the selectivity against the resist film can be improved by decreasing the concentration of fluorine in an etching gas.

Hereinafter, a known plasma processing method will be described with reference to FIG. 1.

FIG. 1 illustrates a schematic construction of an inductively coupled plasma processing system. As shown in FIG. 1, the inner walls of a reaction chamber 10 are covered with quartz plates 11. An induction coil 12 is wound around the outside of the reaction chamber 10. One end of the induction coil 12 is connected to a first RF power supply 13, while the other end of the induction coil 12 is grounded.

A gas inlet port 14 of the reaction chamber 10 is connected to a gas supply source (i.e., gas cylinder) 16 via a mass flow controller 15. A gas outlet port 17 of the reaction chamber 10 is connected to an exhaust pump 19 by way of a pressure control valve 18. Accordingly, the gas pressure inside the reaction chamber 10 is controlled using the mass flow controller 15 and/or the pressure control valve 18 and exhaust pump 19.

A sample stage 20, which will be a lower electrode, is provided inside the reaction chamber 10 and connected to a second RF power supply 22 by way of a matching circuit 21.

A control unit 23 provides control signals to the first and second RF power supplies 12 and 22, mass flow controller 15 and pressure control valve 18. In this manner, the unit 23 controls first RF power supplied from the first RF power supply 12 to the induction coil 12, second RF power supplied from the second RF power supply 22 to the sample stage 22, the flow rate of the gas supplied from the gas supply source 16 to the reaction chamber 10 and that of the gas exhausted from the reaction chamber 10.

The gas pressure inside the reaction chamber 10 is normally controlled to a predetermined value between 0.133 and 1.33 Pa by adjusting the pressure control valve 18 with the exhaust pump 19 operated continuously.

The first RF power is applied from the first RF power supply 13 to the induction coil 12 with a process gas supplied through the gas inlet port 14 into the reaction chamber 10 and with the gas pressure inside the reaction chamber 10 kept at the predetermined value. In this manner, plasma is created from the process gas. Thereafter, the second RF power is applied from the second RF power supply 22 to the sample stage 20, thereby getting the created plasma attracted to a semiconductor substrate that has been placed on the sample stage 20. As a result, a thin film, which has been formed on the surface of the semiconductor substrate, is etched or a thin film is deposited on the surface of the semiconductor substrate.

As described above, a silicon material functions as a fluorine scavenger. Accordingly, if an etching gas containing fluorine is introduced into the reaction chamber 10, then silicon, which is the material of the sample stage 20 and a silicon ring (not shown), combines with that fluorine to produce $SiF_x$ (where x=3 or 4). In this manner, the concentration of fluorine in the etching gas is adjustable and therefore the etch rate is controllable. It is well known that the concentration of fluorine affects the etch rate of a resist film.

Thus, Japanese Laid-Open Publication No. 10-98024 suggests that a fluorocarbon gas, in which the ratio of carbon to fluorine (which will be herein called a "C/F ratio") is relatively high (e.g., $C_5F_8$ gas), is preferably used to increase the selectivity of a silicon dioxide film being dry-etched (or plasma-etched) to a resist film used as a mask.

However, when the present inventors dry-etched a silicon dioxide film using the $C_5F_8$ gas with a high C/F ratio and masking the silicon dioxide film with a resist film, we didn't find that the resultant selectivity increased compared to the conventional $C_2F_6$ gas with a low C/F ratio.

We carried out the experiment in the following manner.

An ICP plasma-enhanced dry etching system was used as an etching system. The power applied to create plasma was set at 1600 W. A mixture of $C_5F_8$ and Ar gases was used as an etching gas. The flow rates of the $C_5F_8$ and Ar gases were defined at 4.7 and 4.0 ml/min, respectively. And the gas pressure was set at 1.33 Pa. A silicon dioxide film was etched using a resist film as a mask under the process conditions such as these.

As a result, although a gas with a high C/F ratio (i.e., the $C_5F_8$ gas) was used, the selectivity against the resist film was just 1.81, which is not so much different from that of the conventional gas with a low C/F ratio (e.g., $C_2F_6$ gas).

SUMMARY OF THE INVENTION

In view of these, an object of the present invention is increasing the selectivity attained when dry etching is carried out using a fluorocarbon gas with a C/F ratio of 0.5 or more.

The present inventors believe that if a silicon dioxide film is dry-etched using a fluorocarbon gas with a high C/F ratio, the selectivity thereof to a resist film increases because of the following reason. Specifically, we believe that a polymer film would be deposited on the surfaces of the silicon dioxide and resist films and decrease the etch rates. Accordingly, if the decrease in etch rate of the silicon dioxide film is less than the decrease in etch rate of the resist film, then the selectivity to the resist film would increase. On the other hand, if the decrease in etch rate of the silicon dioxide film is equal to or greater than the decrease in etch rate of the resist film, then the selectivity to the resist film would not increase.

Thus, the selectivity to the resist film does not always increase by the use of a fluorocarbon gas with a high C/F ratio. More exactly, the selectivity to the resist film can be increased not only by using the fluorocarbon gas with the high C/F ratio but also by making the etch rate of the silicon dioxide film decrease less than the etch rate of the resist film.

Furthermore, we paid special attention to the residence time τ of the fluorocarbon gas, which is given by P×V/Q, where P is the pressure (unit: Pa) of the fluorocarbon gas, V is the volume (unit: L) of the reaction chamber and Q is the flow rate (unit: Pa·L/sec) of the fluorocarbon gas. By applying numerous combinations of pressures and flow rates of the fluorocarbon gas to reaction chambers with various volumes, we tried to find the residence times τ at which the selectivity to the resist film increases. As a result, we found that where a fluorocarbon gas with a C/F ratio of 0.5 or more was used, the selectivity to the resist film increased if the residence time τ was greater than 0.1 sec and equal to or less than 1 sec. That is to say, we found that the selectivity to the resist film did not increase if the residence time τ was equal to or less than 0.1 sec. This means that the deposition of the polymer film accelerated (i.e., the deposition rate of an organic film increased) in that situation.

As can be seen from the equation for the residence time τ=P×V/Q, the residence time τ changes with the volume V of the reaction chamber.

Thus, we also found that if P×W$_0$/Q, which is a product of the residence time (i.e., τ=P×V/Q) and the density Pi of power applied to create plasma (i.e., Pi=W$_0$/V, where W$_0$ is the magnitude of the power and v is the volume of the reaction chamber), is used, the selectivity to the resist film or the deposition rate of the organic film can be increased irrespective of the volume of the reaction chamber.

The basic idea of the present invention was acquired from these findings. Specifically, the scope of the present invention is defined as follows.

A first inventive plasma processing method includes the steps of: placing a substrate inside a reaction chamber of a plasma processing system, a silicon dioxide film having been formed on the surface of the substrate; introducing a fluorocarbon gas, which contains carbon and fluorine and in which a ratio of carbon to fluorine is 0.5 or more, into the reaction chamber; and creating a plasma from the fluorocarbon gas and etching the silicon dioxide film with the plasma. A residence time τ of the fluorocarbon gas in the reaction chamber is controlled at a value greater than 0.1 sec and equal to or less than 1 sec. The residence time τ is given by P×V/Q, where P is a pressure (unit: Pa) of the fluorocarbon gas, V is a volume (unit: L) of the reaction chamber and Q is a flow rate (unit: Pa·L/sec) of the fluorocarbon gas.

In the first plasma processing method, the silicon dioxide film is etched with the residence time τ of the fluorocarbon gas in the reaction chamber controlled at a value greater than 0.1 sec and equal to or less than 1 sec. Thus, the selectivity to the resist film can be increased to two or more with the process stabilized.

A second inventive plasma processing method includes the steps of: placing a substrate inside a reaction chamber of a plasma processing system, a silicon dioxide film having been formed on the surface of the substrate; introducing a fluorocarbon gas, which contains carbon and fluorine and in which a ratio of carbon to fluorine is 0.5 or more, into the reaction chamber; and creating a plasma from the fluorocarbon gas and etching the silicon dioxide film with the plasma. P×W$_0$/Q is controlled at a value greater than $0.8 \times 10^4$ sec·W/m$^3$ and equal to or less than $8 \times 10^4$ sec·W/m$^3$. P×W$_0$/Q is a product of a residence time τ of the fluorocarbon gas in the reaction chamber and a power density Pi of power applied to create the plasma. The residence time τ is given by P×V/Q, where. P is a pressure (unit: Pa) of the fluorocarbon gas, V is a volume (unit: L) of the reaction chamber and Q is a flow rate (unit: Pa·L/sec) of the fluorocarbon gas. The power density Pi is given by W$_0$/V, where W$_0$ is a magnitude (unit: W) of the power and V is the volume (unit: L) of the reaction chamber.

In the second plasma processing method, the silicon di-oxide film is etched with P×W$_0$/Q, which is a product of a residence time τ of the fluorocarbon gas in the reaction chamber and a power density Pi of power applied to create the plasma, controlled at a value greater than $0.8 \times 10^4$ sec·W/m$^3$ and equal to or less than $8 \times 10^4$ sec·W/m$^3$. Thus, the selectivity to the resist film can be increased to two or more with the process stabilized.

A third inventive plasma processing method includes the steps of: placing a substrate inside a reaction chamber of a plasma processing system; introducing a fluorocarbon gas, which contains carbon and fluorine and in which a ratio of carbon to fluorine is 0.5 or more, into the reaction chamber; and creating a plasma from the fluorocarbon gas and depositing an organic film on the substrate using the plasma. A residence time τ of the fluorocarbon gas is controlled at 0.1 sec or less. The residence time τ is given by P×V/Q, where P is a pressure (unit: Pa) of the fluorocarbon gas, V is a volume (unit: L) of the reaction chamber and Q is a flow rate (unit: Pa·L/sec) of the fluorocarbon gas.

In the third plasma processing method, an organic film is deposited with the residence time τ of the fluorocarbon gas in the reaction chamber controlled at 0.1 sec or less. Thus, the deposition rate of the organic film can be increased with the process stabilized.

A fourth inventive plasma processing method includes the steps of: placing a substrate inside a reaction chamber of a plasma processing system; introducing a fluorocarbon gas, which contains carbon and fluorine and in which a ratio of carbon to fluorine is 0.5 or more, into the reaction chamber; and creating a plasma from the fluorocarbon gas and depositing an organic film on the substrate using the plasma. P×W$_0$/Q is controlled at $0.8 \times 10^4$ sec·W/m$^3$ or less. P×W$_0$/Q is a product of a residence time τ of the fluorocarbon gas and a power density Pi of power applied to create the plasma. The residence time τ is given by P×V/Q, where P is a pressure (unit: Pa) of the fluorocarbon gas, V is a volume (unit: L) of the reaction chamber and Q is a flow rate (unit: Pa·L/sec) of the fluorocarbon gas. The power density Pi is given by W$_0$/V, where W$_0$ is a magnitude (unit: W) of the power and V is the volume (unit: L) of the reaction chamber.

In the fourth plasma processing method, an organic film is deposited with P×W$_0$/Q, which is a product of a residence time τ of the fluorocarbon gas in the reaction chamber and a power density Pi of power applied to create the plasma, controlled at $0.8 \times 10^4$ sec·W/m$^3$ or less. Thus, the deposition rate of the organic film can be increased with the process stabilized.

In the first through fourth plasma processing methods, the fluorocarbon gas is preferably a gas containing at least one of $C_4F_8$, $C_4F_6$, $C_3F_8$, $C_5F_8$ and $C_6F_6$ gases.

In the first through fourth plasma processing methods, the residence time τ is preferably controlled by a mass flow controller provided for the plasma processing system and/or a valve and a pump provided for the plasma processing system.

A fifth inventive plasma processing method includes the steps of: placing a substrate inside a reaction chamber of a plasma processing system, a silicon dioxide film having been formed on the surface of the substrate; introducing a first fluorocarbon gas, which contains carbon and fluorine and in which a ratio of carbon to fluorine is 0.5 or more, into the reaction chamber; creating a first plasma from the first fluorocarbon gas and etching the silicon dioxide film with the first plasma; introducing a second fluorocarbon gas, which contains carbon and fluorine and in which a ratio of carbon to fluorine is 0.5 or more, into the reaction chamber; and creating a second plasma from the second fluorocarbon gas and depositing an organic film on the etched silicon dioxide film using the second plasma. A first residence time $\tau_1$ of the first fluorocarbon gas in the reaction chamber is controlled at a value greater than 0.1 sec and equal to or less than 1 sec. The first residence time $\tau_1$ is given by $P_1 \times V/Q_1$, where $P_1$ is a pressure (unit: Pa) of the first fluorocarbon gas, V is a volume (unit: L) of the reaction chamber and $Q_1$ is a flow rate (unit: Pa·L/sec) of the first fluorocarbon gas. A second residence time $\tau_2$ of the second fluorocarbon gas in the reaction chamber is controlled at 0.1 sec or less. The second residence time $\tau_2$ is given by $P_2 \times V/Q_2$, where $P_2$ is a pressure (unit: Pa) of the second fluorocarbon gas, V is the volume (unit: L) of the reaction chamber and $Q_2$ is a flow rate (unit: Pa·L/sec) of the second fluorocarbon gas. In the fifth plasma processing method, the selectivity to the resist film can be increased to two or more and the deposition rate of the organic film can also be increased with the process stabilized.

A sixth inventive plasma processing method includes the steps of: placing a substrate inside a reaction chamber of a plasma processing system, a silicon dioxide film having been formed on the surface of the substrate; introducing a first fluorocarbon gas, which contains carbon and fluorine and in which a ratio of carbon to fluorine is 0.5 or more, into the reaction chamber; creating a first plasma from the first fluorocarbon gas and etching the silicon dioxide film with the first plasma; introducing a second fluorocarbon gas, which contains carbon and fluorine and in which a ratio of carbon to fluorine is 0.5 or more, into the reaction chamber; and creating a second plasma from the second fluorocarbon gas and depositing an organic film on the etched silicon dioxide film using the second plasma. $P_1 \times W_1/Q_1$ is controlled at a value greater than $0.8 \times 10^4$ sec·W/m$^3$ and equal to or less than $8 \times 10^4$ sec·W/m$^3$. $P_1 \times W_1/Q_1$ is a first product of a first residence time $\tau_1$ of the first fluorocarbon gas in the reaction chamber and a power density $Pi_1$ of first power applied to create the first plasma. The first residence time $\tau_1$ is given by $P_1 \times V/Q_1$, where $P_1$ is a pressure (unit: Pa) of the first fluorocarbon gas, V is a volume (unit: L) of the reaction chamber and $Q_1$ is a flow rate (unit: Pa·L/sec) of the first fluorocarbon gas. The power density $Pi_1$, is given by $W_1/V$, where $W_1$ is a magnitude (unit: W) of the first power and V is the volume (unit: L) of the reaction chamber. And $P_2 \times W_2/Q_2$ is controlled at $0.8 \times 10^4$ sec·W/m$^3$ or less. $P_2 \times W_2/Q_2$ is a second product of a second residence time $\tau_2$ of the second fluorocarbon gas in the reaction chamber and a power density $Pi_2$ of second power applied to create the second plasma. The second residence time $\tau_2$ is given by $P_2 \times V/Q_2$, where $P_2$ is a pressure (unit: Pa) of the second fluorocarbon gas, V is the volume (unit: L) of the reaction chamber and $Q_2$ is a flow rate (unit: Pa·L/sec) of the second fluorocarbon gas. The power density $Pi_2$ is given by $W_2/V$, where $W_2$ is a magnitude (unit: W) of the second power and V is the volume (unit: L) of the reaction chamber.

In the sixth plasma processing method, the selectivity to the resist film can be increased to two or more and the deposition rate of the organic film can also be increased with the process stabilized.

In the fifth or sixth plasma processing method, the first fluorocarbon gas is preferably a gas containing at least one of $C_4F_8$, $C_3F_8$, $C_5F_8$ and $C_6F_6$ gases, while the second fluorocarbon gas is preferably a gas containing at least one of $C_4F_8$, $C_4F_6$, $C_3F_8$, $C_5F_8$ and $C_6F_6$ gases.

In the fifth or sixth plasma processing method, each of the first and second residence times $\tau_1$ and $\tau_2$ is preferably controlled by a mass flow controller provided for the plasma processing system and/or a valve and a pump provided for the plasma processing system.

DESCRIPTION OF THE PREFERRED EMBODIMENTS

Figure 1:
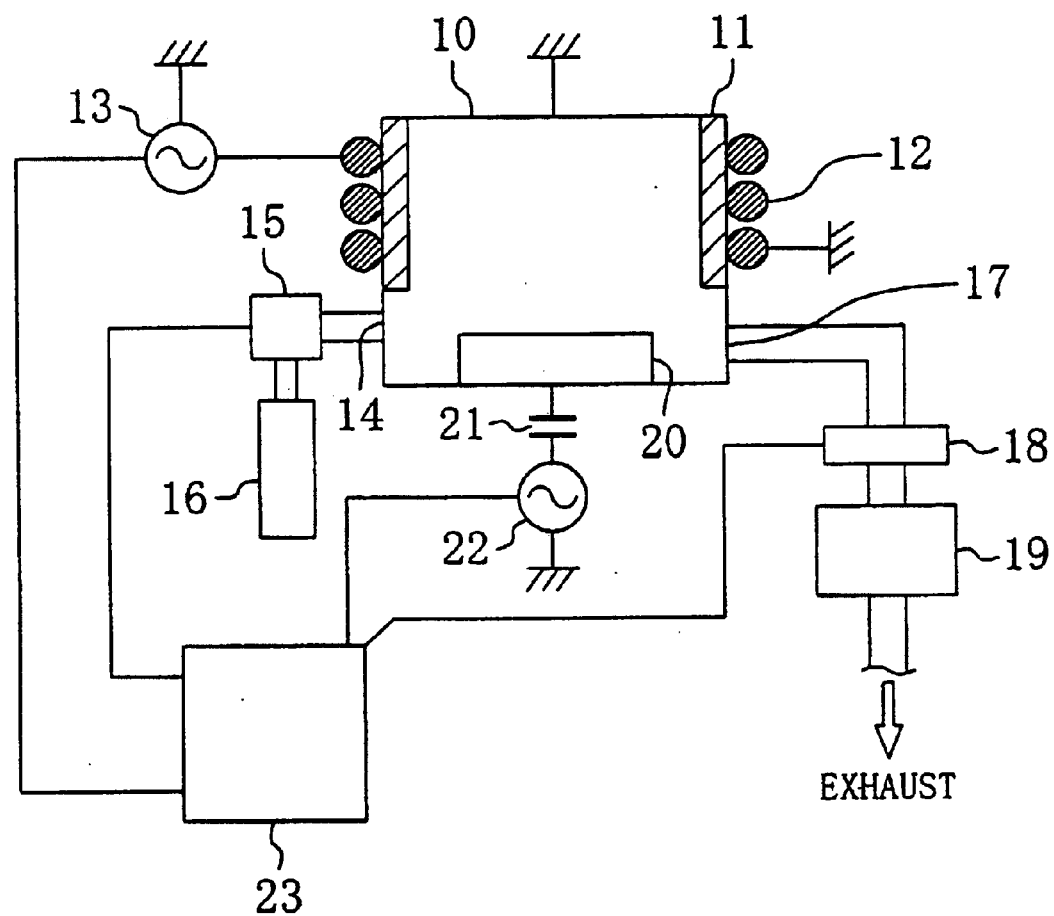
FIG. 1 is a schematic cross-sectional view illustrating an inductively coupled plasma processing system applicable to the plasma processing methods of the prior art and embodiments of the present invention.

Hereinafter, the basic principle of the invention will be described before plasma processing methods according to respective embodiments of the present invention are detailed.

The following Tables 1, 2 and 3 illustrate the results of experiments that were carried out to obtain the residence time τ of $C_5F_8$ gas, which was used as an etching gas, in a reaction chamber where a plasma etching process was performed with the volume of the reaction chamber and the flow rate and pressure of the $C_5F_8$ gas changed.

TABLE 1

× 0.133 Pa

|     | 1     | 5     | 10    | 20    | 30    | 40    | 50    | 60    | 80    | 100   |
|-----|-------|-------|-------|-------|-------|-------|-------|-------|-------|-------|
| 1   | 1.976 | 9.881 | 19.76 | 39.53 | 59.29 | 79.05 | 98.81 | 118.6 | 158.1 | 197.6 |
| 5   | 0.395 | 1.976 | 3.953 | 7.905 | 11.86 | 15.81 | 19.76 | 23.72 | 31.62 | 39.53 |
| 10  | 0.198 | 0.988 | 1.976 | 3.953 | 5.929 | 7.905 | 9.881 | 11.86 | 15.81 | 19.76 |
| 15  | 0.132 | 0.659 | 1.318 | 2.635 | 3.953 | 5.27  | 6.588 | 7.905 | 10.54 | 13.18 |
| 20  | 0.099 | 0.494 | 0.988 | 1.976 | 2.964 | 3.953 | 4.941 | 5.929 | 7.905 | 9.881 |
| 25  | 0.079 | 0.395 | 0.791 | 1.581 | 2.372 | 3.162 | 3.953 | 4.743 | 6.324 | 7.905 |
| 50  | 0.04  | 0.198 | 0.395 | 0.791 | 1.186 | 1.581 | 1.976 | 2.372 | 3.162 | 3.953 |
| 100 | 0.02  | 0.099 | 0.198 | 0.395 | 0.593 | 0.791 | 0.988 | 1.186 | 1.581 | 1.976 |
| 150 | 0.013 | 0.066 | 0.132 | 0.264 | 0.395 | 0.527 | 0.659 | 0.791 | 1.054 | 1.318 |
| 200 | 0.01  | 0.049 | 0.099 | 0.198 | 0.296 | 0.395 | 0.494 | 0.593 | 0.791 | 0.988 |

× 133.3/79.5
(Pa · L/sec)

TABLE 2

× 0.133 Pa

|     | 1     | 5     | 10    | 20    | 30    | 40    | 50    | 60    | 80    | 100   |
|-----|-------|-------|-------|-------|-------|-------|-------|-------|-------|-------|
| 1   | 0.791 | 3.953 | 7.905 | 15.81 | 23.72 | 31.62 | 39.53 | 47.43 | 63.24 | 79.05 |
| 5   | 0.158 | 0.791 | 1.581 | 3.162 | 4.743 | 6.324 | 7.905 | 9.486 | 12.65 | 15.81 |
| 10  | 0.079 | 0.395 | 0.791 | 1.581 | 2.372 | 3.162 | 3.953 | 4.743 | 6.324 | 7.905 |
| 15  | 0.053 | 0.264 | 0.527 | 1.054 | 1.581 | 2.108 | 2.635 | 3.162 | 4.216 | 5.27  |
| 20  | 0.04  | 0.198 | 0.395 | 0.791 | 1.186 | 1.581 | 1.976 | 2.372 | 3.162 | 3.953 |
| 25  | 0.032 | 0.158 | 0.316 | 0.632 | 0.949 | 1.265 | 1.581 | 1.897 | 2.53  | 3.162 |
| 50  | 0.016 | 0.079 | 0.158 | 0.316 | 0.474 | 0.632 | 0.791 | 0.949 | 1.265 | 1.581 |
| 100 | 0.008 | 0.04  | 0.079 | 0.158 | 0.237 | 0.316 | 0.395 | 0.474 | 0.632 | 0.791 |
| 150 | 0.005 | 0.026 | 0.053 | 0.105 | 0.158 | 0.211 | 0.264 | 0.316 | 0.422 | 0.527 |
| 200 | 0.004 | 0.02  | 0.04  | 0.079 | 0.119 | 0.158 | 0.198 | 0.237 | 0.316 | 0.395 |

× 133.3/79.5
(Pa · L/sec)

TABLE 3

× 0.133 Pa

|     | 1     | 5     | 10    | 20    | 30    | 40    | 50    | 60    | 80    | 100   |
|-----|-------|-------|-------|-------|-------|-------|-------|-------|-------|-------|
| 1   | 3.953 | 19.76 | 39.53 | 79.05 | 118.6 | 158.1 | 197.6 | 237.2 | 316.2 | 395.3 |
| 5   | 0.791 | 3.953 | 7.905 | 15.81 | 23.72 | 31.62 | 39.53 | 47.43 | 63.24 | 79.05 |
| 10  | 0.395 | 1.976 | 3.953 | 7.905 | 11.86 | 15.81 | 19.76 | 23.72 | 31.62 | 39.53 |
| 15  | 0.264 | 1.318 | 2.635 | 5.27  | 7.905 | 10.54 | 13.18 | 15.81 | 21.08 | 26.35 |
| 20  | 0.198 | 0.988 | 1.976 | 3.953 | 5.929 | 7.905 | 9.881 | 11.86 | 15.81 | 19.76 |
| 25  | 0.158 | 0.791 | 1.581 | 3.162 | 4.743 | 6.324 | 7.905 | 9.486 | 12.65 | 15.81 |
| 50  | 0.079 | 0.395 | 0.791 | 1.581 | 2.372 | 3.162 | 3.953 | 4.743 | 6.324 | 7.905 |
| 100 | 0.04  | 0.198 | 0.395 | 0.791 | 1.186 | 1.581 | 1.976 | 2.372 | 3.162 | 3.953 |
| 150 | 0.026 | 0.132 | 0.264 | 0.527 | 0.791 | 1.054 | 1.318 | 1.581 | 2.108 | 2.635 |
| 200 | 0.02  | 0.099 | 0.198 | 0.395 | 0.593 | 0.791 | 0.988 | 1.186 | 1.581 | 1.976 |

× 133.3/79.5
(Pa · L/sec)

Specifically, Table 1, 2 and 3 show the results obtained for the reaction chambers with volumes of 25, 10 and 50 liters, respectively. The experiments for obtaining the residence times τ were carried out with the flow rate of the gas measured by mL per minute under standard conditions. Thus, according to the conversion rate that a gas flow rate of 79.05 mL per minute under standard conditions is equivalent to 133.3 Pa·L/sec, the flow rate of the $C_5F_8$ gas is represented by the unit of ×133.3/79.05 Pa·/sec. Also, the gas pressure was measured by mTorr. Thus, according to the conversion rate that 1 mTorr is equivalent to 0.133 Pa, the pressure of the $C_5F_8$ gas is represented by the unit of ×0.133 Pa.

The data on the residence time τ of the gas shown in. Tables 1, 2 and 3 was obtained by substituting the volume (unit: L) of the reaction chamber and the flow rate (unit: Pa·L/sec) and pressure (unit: Pa) of the gas for the equation τ=P×V/Q, where τ is the residence time (unit: sec) of the gas in the reaction chamber, P is the pressure (unit: Pa) of the gas, V is the volume (unit: L) of the reaction chamber and Q is the flow rate (unit: Pa·L/sec) of the gas. In Tables 1, 2 and 3, the residence times, at which the selectivity of the silicon dioxide film to the resist film are two or more, are enclosed with the bold lines.

As can be seen from Tables 1, 2 and 3, in performing a plasma etching process using the $C_5F_8$ gas as an etching gas, the selectivity of the silicon dioxide film to the resist film can be two or more if the residence time τ is greater than 1.0 sec and equal to or less than 1 sec. Some residence time values τ, which are not included inside the bold lines, fall within the range from 1.0 to 1 sec. However, it is known from the results of experiments that the process will be stabilized at any flow rate and any pressure of the gas inside the bold lines. In Tables 1, 2 and 3, the residence time τ is distributed over a wide range from 0.01 to 395.3 sec. In contrast, the present invention selects a very narrow range of 1.0 to 1 sec. And we found that if the residence time is selected from this very narrow range, the process will be stabilized and the selectivity of the silicon dioxide film to the resist film will become two or more.

If the residence time τ is 0.1 sec or less, the selectivity to the resist film decreases. This means that the deposition of polymers accelerates, i.e., the deposition rate of an organic film increases. Accordingly, by setting the residence time τ of the gas at 0.1 sec or less, the deposition rate of an organic film can be increased.

As can be seen from the equation τ=P×V/Q, the residence time τ changes with the volume V of the reaction chamber.

Thus, E=P×$W_0$/Q, which is a product of a power density Pi of the power applied to create the plasma and the residence time τ, is used. The power density Pi is given by $W_0$/V, where $W_0$ is a magnitude (unit: W) of the power and V is the volume (unit: L) of the reaction chamber. Then, the selectivity to the resist film or the deposition rate of the organic film can be increased irrespective of the volume of the reaction chamber.

A residence time τ greater than 1.0 sec and equal to or less than 1 sec corresponds to a product E of the residence time τ and power density Pi, which is greater than $0.8 \times 10^4$ sec·W/m$^3$ and equal to or less than $8 \times 10^4$ sec·W/m$^3$.

Accordingly, if the product E of residence time τ and power density Pi is greater than $0.8 \times 10^4$ sec·W/m$^3$ and equal to or less than $8 \times 10^4$ sec·W/m$^3$, then the process will be stabilized and the selectivity of the silicon dioxide film to the resist film will be two or more.

In other words, if the product E of residence time τ and power density Pi is $0.8 \times 10^4$ sec·W/m$^3$ or less, then the deposition rate of the organic film increases.

Figure 2:
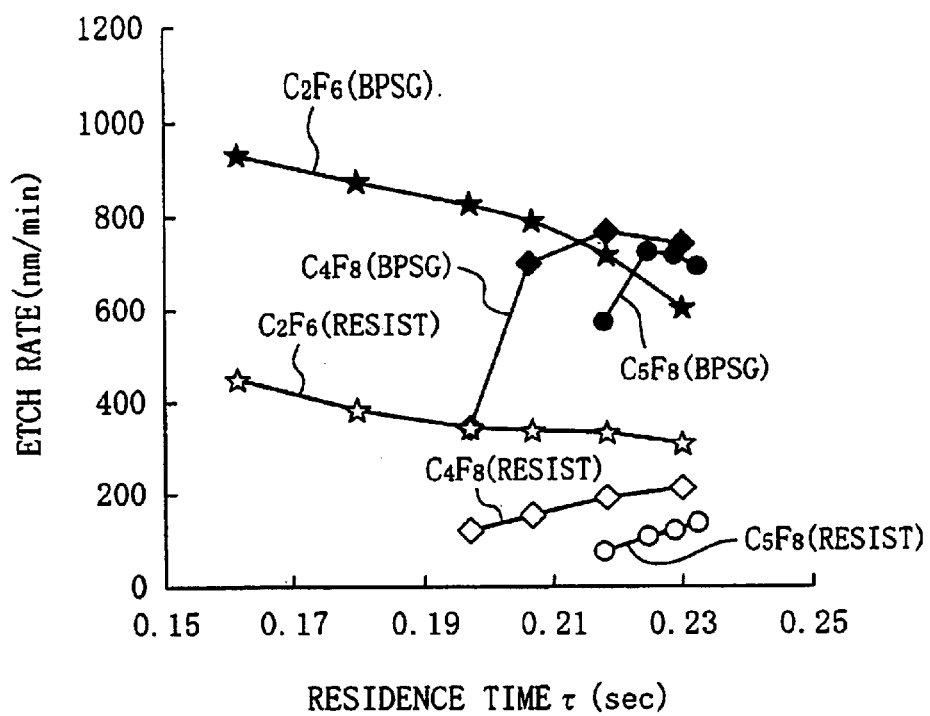
FIG. 2 illustrates relationships between the residence time and the etch rate of a BPSG or resist film that were obtained in respective plasma etching processes performed with the etching gas changed.

FIG. 2 illustrates relationships between the residence time τ and the etch rate of a BPSG (borophosphosilicate glass) or resist film that were obtained in respective plasma etching processes performed with the etching gas changed. In FIG. 2, the curve plotted with ★ represents the etch rate of the BPSG film where $C_2F_6$ gas was used. The curve plotted with ◆ represents the etch rate of the BPSG film where $C_4F_8$ gas was used. The curve plotted with ● represents the etch rate of the BPSG film where $C_5F_8$ gas was used. The curve plotted with ☆ represents the etch rate of the resist film where the $C_2F_6$ gas was used. The curve plotted with ◇ represents the etch rate of the resist film where the $C_4F_8$ gas was used. And the curve plotted with ○ represents the etch rate of the resist film where the $C_5F_8$ gas was used.

As can be seen from FIG. 2, where the $C_4F_8$ or $C_5F_8$ gas is used, the shorter the residence time, the lower the etch rates of the BPSG and resist films. This is probably because a polymer film is deposited on the surface of the BPSG or resist film and inhibits the etching action. As also can be seen from FIG. 2, where the $C_2F_6$ gas is used, the shorter the residence time, the higher the etch rates of the BPSG and resist films to the contrary.

Figure 3:
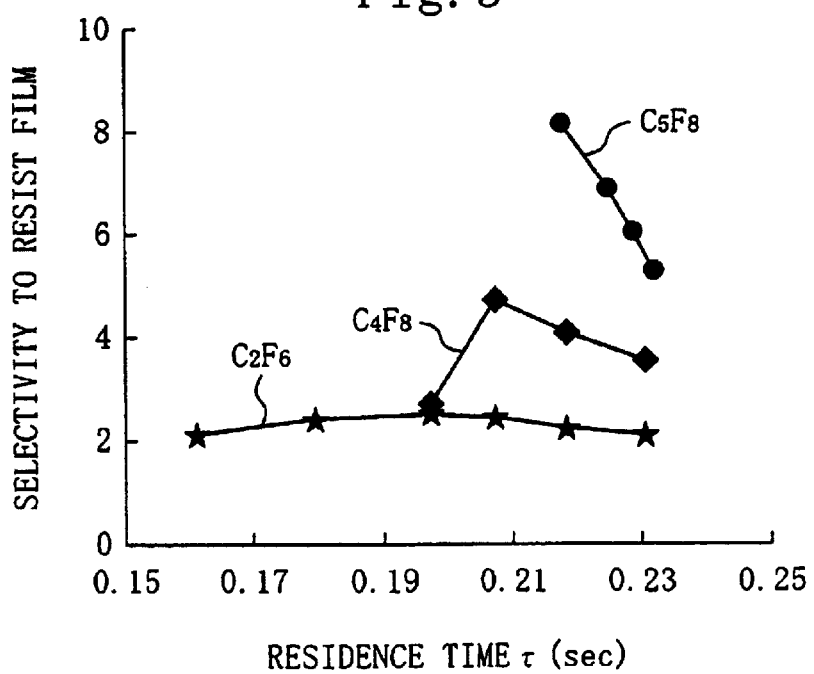
FIG. 3 illustrates relationships between the residence time and the selectivity to the resist film that were obtained in respective plasma etching processes performed with the etching gas changed.

FIG. 3 illustrates the dependence of the ratio of the etch rate of the BPSG film to that of the resist film, i.e., the selectivity to the resist film, on the residence time τ. In FIG. 3, the curves plotted with ★, ◆ and ● represent the selectivities where $C_2F_6$, $C_4F_8$ and $C_5F_8$ gases were used, respectively.

As can be seen from FIG. 3, where the $C_4F_8$ or $C_5F_8$ gas is used, the shorter the residence time, the higher the selectivity to the resist film. However, where the $C_4F_8$ gas is used, the selectivity decreases if the residence time is 0.2 sec or less. This is because the decrease in etch rate of the BPSG film exceeds the decrease in etch rate of the resist film. As also can be seen from FIG. 3, where the $C_2F_6$ gas is used, the selectivity hardly depends on the residence time.

Taking these results into consideration, we can confirm that where a fluorocarbon gas with a carbon ratio of 0.5 or more, e.g., $C_4F_8$ or $C_5F_8$ gas, is used, the etch selectivity can be increased by controlling the residence time at a value greater than 0.1 sec and equal to or less than 1 sec.

Figure 4:
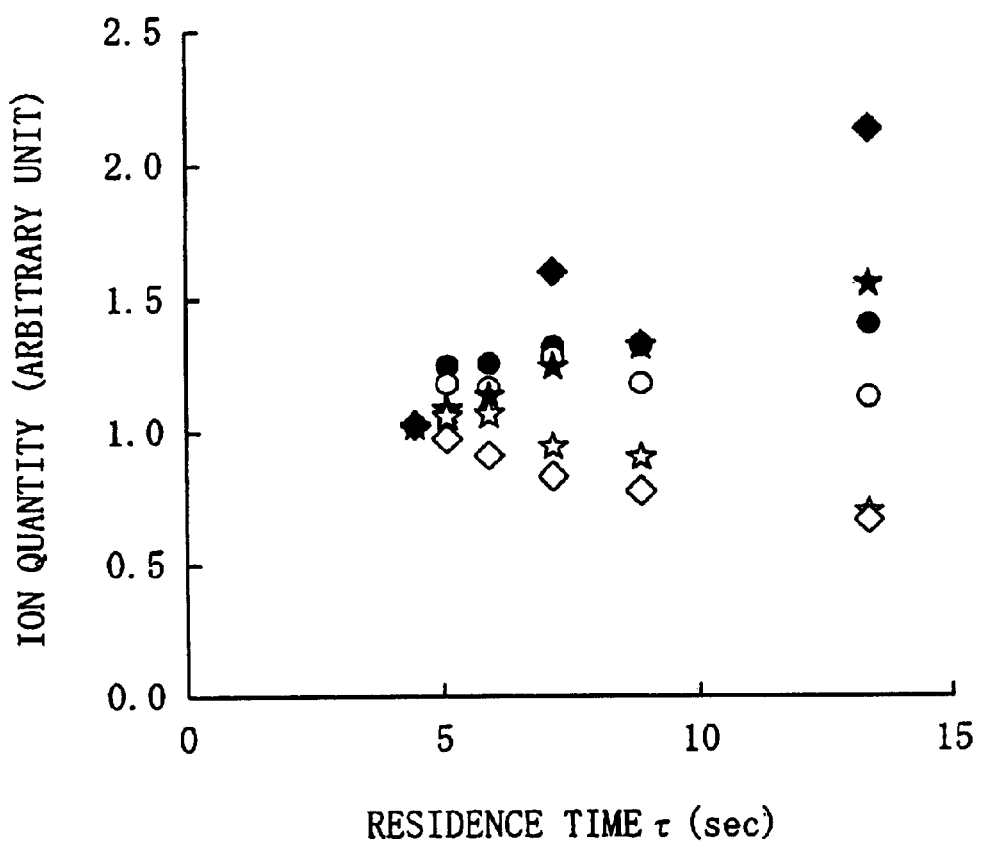
FIG. 4 illustrates the dependence of various kinds of ions on the residence time where plasma was created from a fluorocarbon gas in an inductively coupled plasma processing system.

FIG. 4 illustrates the dependence of ion quantities of $F^-$, $CF^{3-}$, $C_2F_5^-$, $C_5F_7^-$, $C_7F_{11}^-$ and $C_8F_{11}^-$ ions on the residence time where plasma was created from a fluorocarbon gas in an inductively coupled plasma processing system. This measurement was carried out by an electron attachment mass spectrometry. Accordingly, the $F^-$ ions were created through the dissociative electron attachment process from all of $C_xF_y$ molecules. The $CF^{3-}$ ions were created through the dissociative electron attachment process from $CF_4$ molecules. The $C_2F_5^-$ ions were created through the dissociative electron attachment process from $C_2F_6$ molecules. And the $C_5F_7^-$, $C_7F_{11}^-$ and $C_8F_{11}^-$ ions were created through both a similar dissociative electron attachment process and a non-dissociative electron attachment process.

As can be seen from FIG. 4, as the residence time is shortened, the lower-order ions such as $F^-$, $CF^{3-}$ and $C_2F_5^-$ ions decrease, while the higher-order ions such as $C_5F_7^-$, $C_7F_{11}^-$ and $C_8F_{11}^-$ ions increase. In other words, as the residence time is shortened, the lower-order molecules decrease while the higher-order molecules increase. Accordingly, it can be seen that the shorter the residence time, the higher the selectivity to the resist film.

Figure 5:
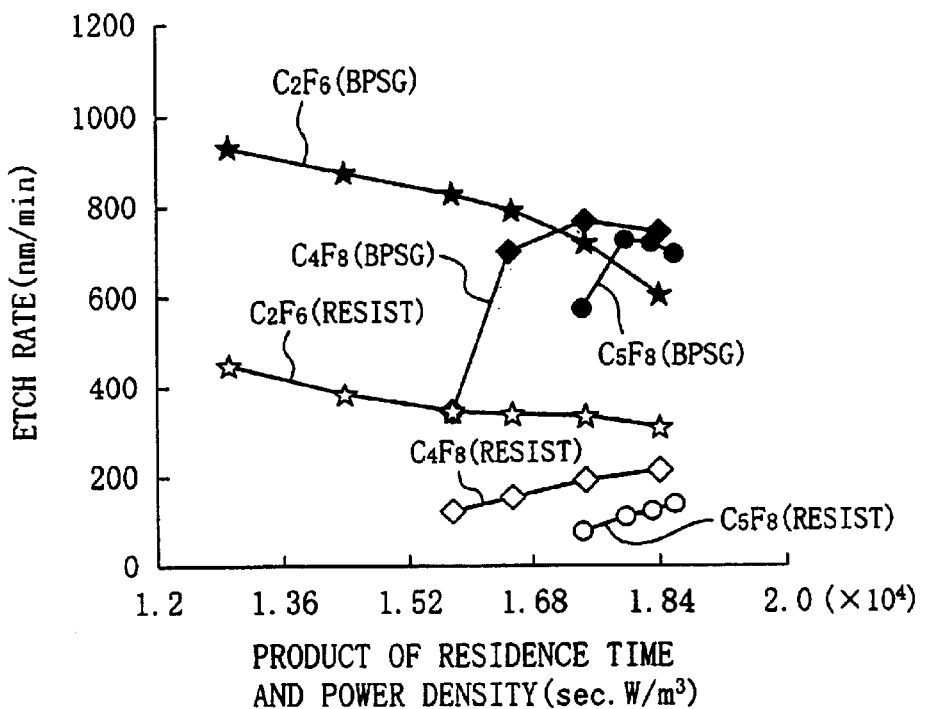
FIG. 5 illustrates relationships between the product of residence time and power density and the etch rate of a BPSG or resist film that were obtained in respective plasma etching processes performed with the etching gas changed.

FIG. 5 illustrates relationships between the product E of residence time τ and power density Pi and the etch rate of the BPSG or resist film that were obtained in respective plasma etching processes performed with the etching gas changed. The results shown in FIG. 5 were obtained with the power density Pi supposed to be 1800 W. In FIG. 5, the curve plotted with ★ represents the etch rate of the BPSG film where $C_2F_6$ gas was used. The curve plotted with ◆ represents the etch rate of the BPSG film where $C_4F_8$ gas was used. The curve plotted with ● represents the etch rate of the BPSG film where $C_5F_8$ gas was used. The curve plotted with ☆ represents the etch rate of the resist film where the $C_2F_6$ gas was used. The curve plotted with ◇ represents the etch rate of the resist film where the $C_4F_8$ gas was used. And the curve plotted with ○ represents the etch rate of the resist film where the $C_5F_8$ gas was used.

As can be seen from FIG. 5, where the $C_4F_8$ or $C_5F_8$ gas is used, the smaller the product E of residence time and power density, the lower the etch rates of the BPSG and resist films. This is because a relationship similar to the above-described one between the residence time τ and the etch rates of the BPSG and resist films is also met herein.

Figure 6:
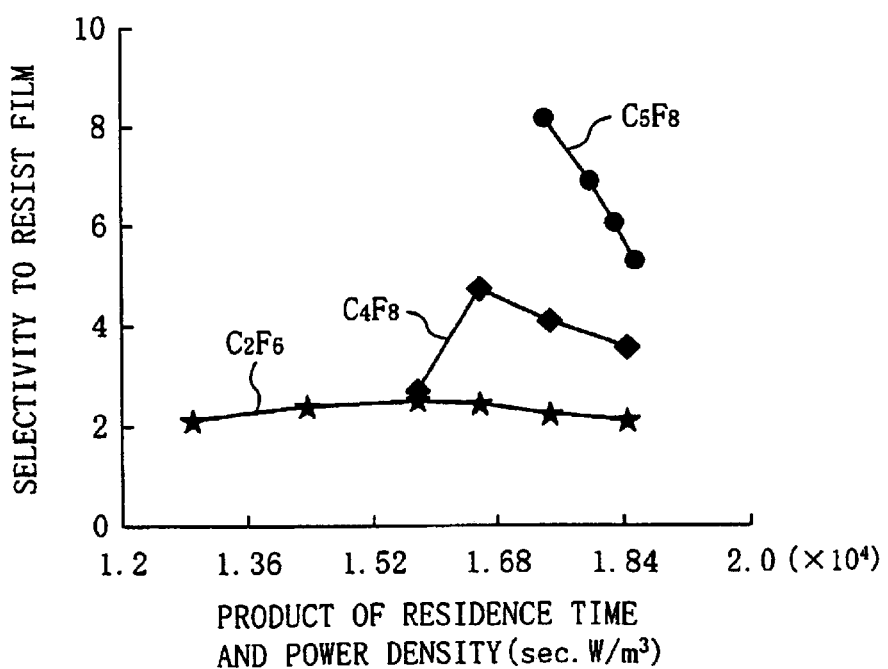
FIG. 6 illustrates relationships between the product of residence time and power density and the selectivity to the resist film that were obtained in respective plasma etching processes performed with the etching gas changed.

FIG. 6 illustrates the dependence of the selectivity to the resist film on the product E of residence time and power density. The results shown in FIG. 6 were obtained with the power density Pi supposed to be 1800 W. In FIG. 6, the curves plotted with ★, ◆ and ● represent the selectivities where $C_2F_6$, $C_4F_8$ and $C_5F_8$ gases were used, respectively.

As can be seen from FIG. 6, where the $C_4F_8$ or $C_5F_8$ gas is used, the smaller the product E of residence time and power density, the higher the selectivity to the resist film. This is because a relationship similar to the above-described one between the residence time and the selectivity is also met herein.

Taking these results into consideration, we can confirm that where a fluorocarbon gas with a carbon ratio of 0.5 or more, e.g., $C_4F_8$ or $C_5F_8$ gas, is used, the etch selectivity can be increased by controlling the product E of residence time and power density at a value greater than $0.8 \times 10^4$ sec·W/m³ and equal to or less than $8 \times 10^4$ sec·W/m³.

Figure 7:
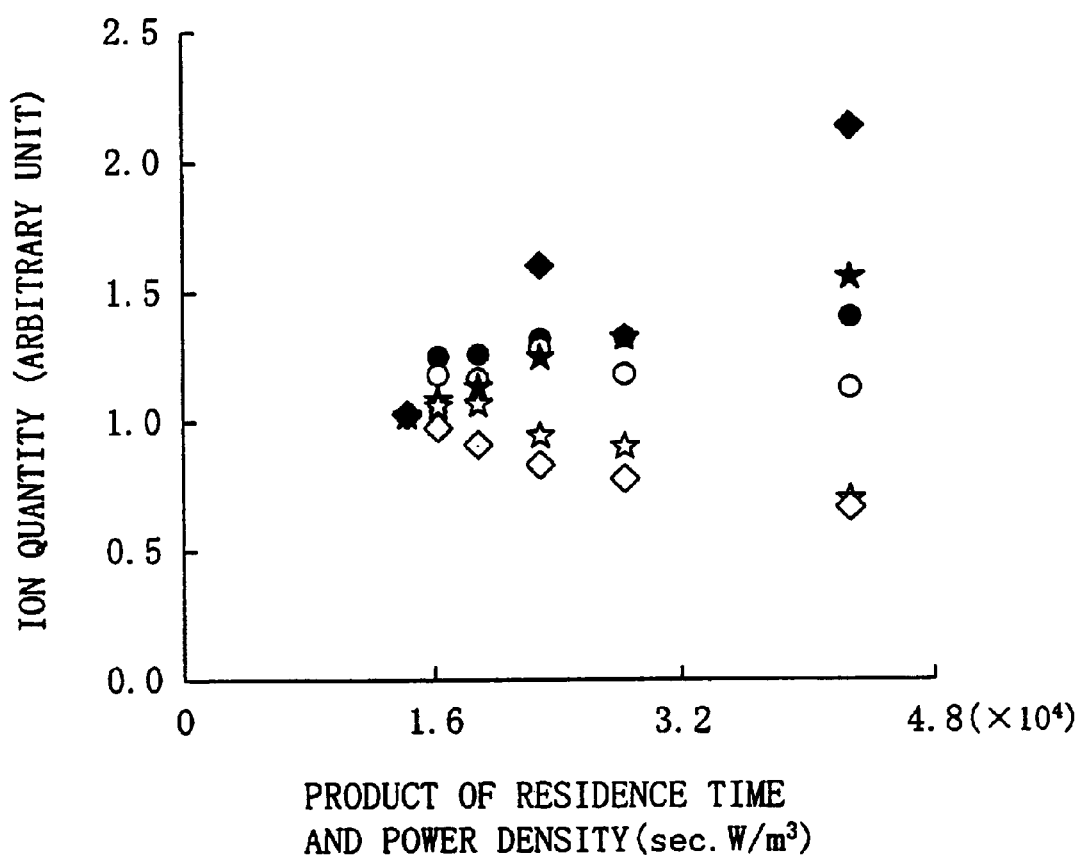
FIG. 7 illustrates the dependence of various kinds of ions on the product of residence time and power density where plasma was created from a fluorocarbon gas in an inductively coupled plasma processing system.

FIG. 7 illustrates the dependence of ion quantities of $F^-$, $CF^{3-}$, $C_2F_5^-$, $C_5F_7^-$, $C_7F_{11}^-$ and $C_8F_{11}^-$ ions on the product E of residence time and power density where plasma was created from a fluorocarbon gas in an inductively coupled plasma processing system.

As can be seen from FIG. 7, as the product E of residence time and power density is decreased, the lower-order ions such as $F^-$, $CF^{3-}$ and $C_2F_5^-$ ions decrease, while the higher-order ions such as $C_5F_7^-$, $C_7F_{11}^-$ and $C_8F_{11}^-$ ions increase. That is to say, it can be seen that the selectivity to the resist film can be increased by decreasing the product E of residence time and power density.

Figure 8A:
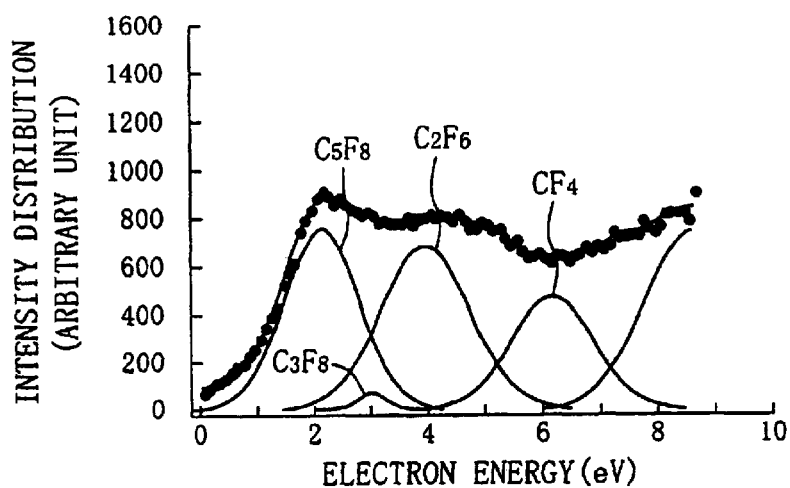
FIGS. 8(a), 8(b) and 8(c) illustrate the intensity distributions of electron energy of F$^-$ ions that were measured at residence times of 4.5, 5.2 and 13.5 seconds, respectively.
Figure 8B:
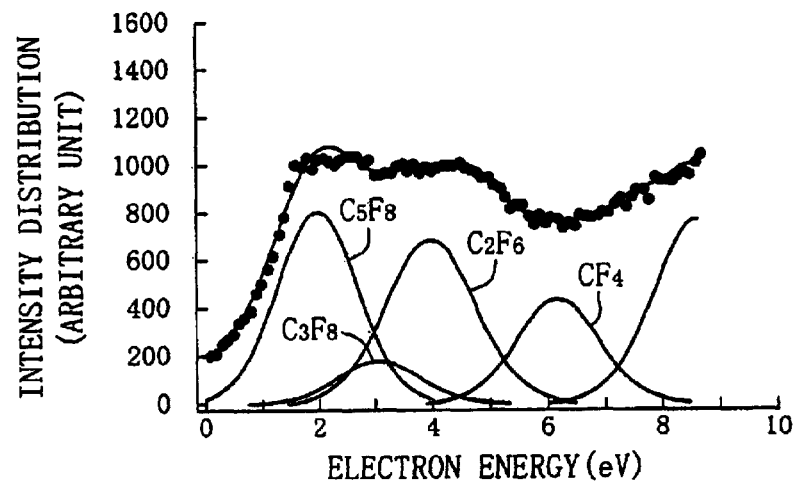
Figure 8C:
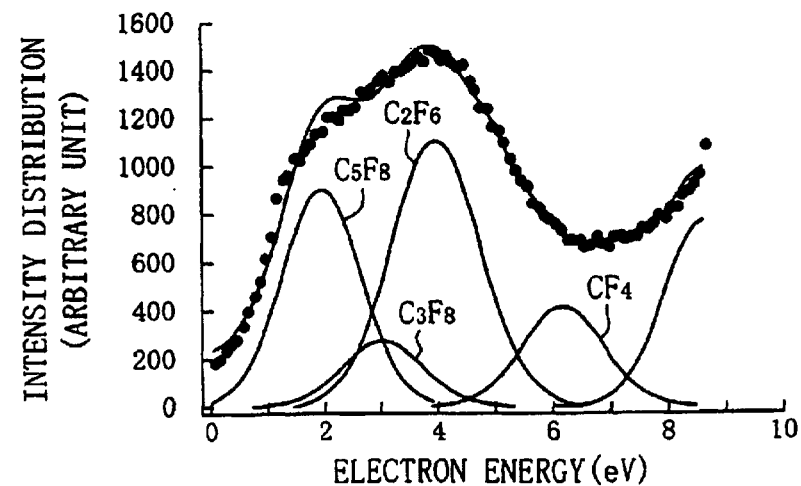

FIGS. 8(a) through 8(c) illustrate the intensity distributions of electron energy of $F^-$ ions using the residence time as a parameter. Specifically, FIGS. 8(a), 8(b) and 8(c) illustrate the results where the residence time was 4.5, 5.2 and 13.5 seconds, respectively. These intensity distributions can be obtained for molecules with a known cross section, from which a dissociative fragment is observable.

As can be seen from FIGS. 8(a) through 8(c), as the residence time increases, the $C_2F_6$ and $C_3F_8$ gases increase. This phenomenon is in agreement with the results shown in FIG. 3. That is to say, it can be seen from FIGS. 8(a) through 8(c) that a fluorocarbon gas to be regulated, such as $C_2F_6$ or $C_3F_8$ gas, which will have detrimental effect on the environment, can be reduced by shortening the residence time.

Japanese Laid-Open Publication No. 5-259119 proposes a technique of increasing the etch selectivity by shortening the residence time τ using a high-speed exhaust pump. The technique disclosed in Japanese Laid-Open Publication No. 5-259119, specifically, the 51$^{st}$ paragraph, FIG. 7 and its associated description, appears to be similar to the present invention.

However, Japanese Laid-Open Publication No. 5-259119 discloses nothing about the etching gas. Rather, a problem to be solved by the subject matter of Japanese Laid-Open Publication No. 5-259119 relates to reducing the effects of a reactant (e.g., $CO_2$) produced from a wafer by exhausting $CO_2$ (which is on the right side of a chemical formula: $SiO_2 + CF_x \rightarrow SiF_x + CO_2$) at high speeds.

In contrast, the present invention has nothing to do with such a problem. Instead, the present invention consists in the finding that to increase the selectivity of a film to a resist film when the film should be etched using a gas with a high C/F ratio, the residence time τ or the product E of residence time and power density should be set within a predetermined range. Thus, the subject matter of Japanese Laid-open Publication No. 5-259119, which specifies no etching gases, is definitely different from the present invention, which specifies a fluorocarbon gas with a C/F ratio of 2 or more as the process gas, in the technical concept, structure and effects.

Embodiment 1

Figure 9:
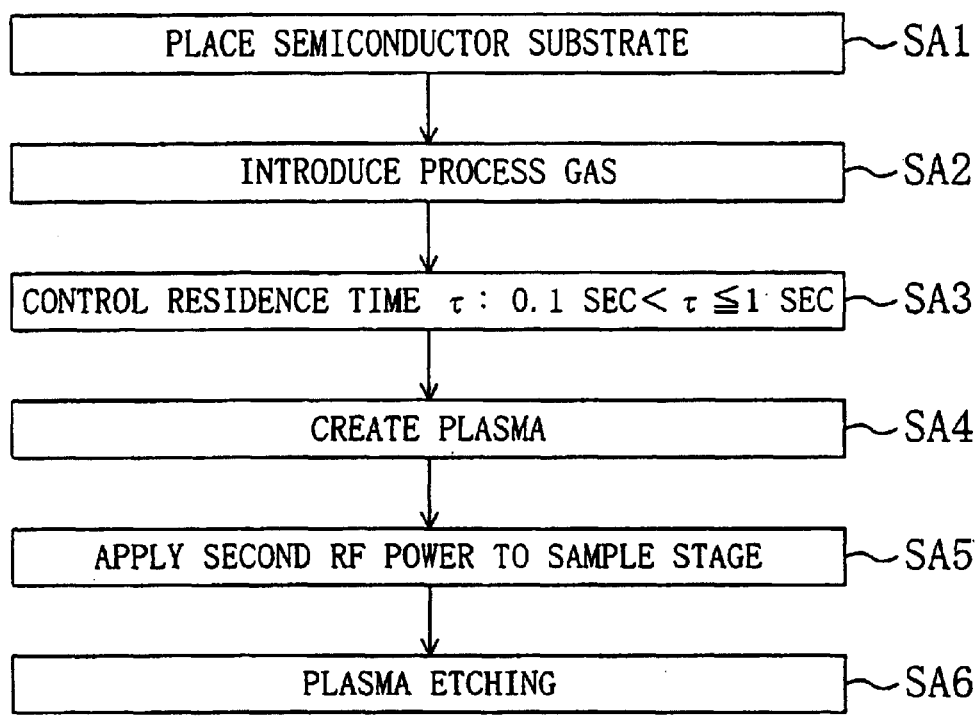
FIG. 9 is a flowchart illustrating a plasma processing method according to a first embodiment.

Hereinafter, a plasma processing method according to a first embodiment will be described with reference to FIGS. 1 and 9.

First, in Step SA1, a semiconductor substrate is loaded into the reaction chamber 10 of the plasma processing system and placed on the sample stage 20. In this case, a silicon dioxide film has been formed on the semiconductor substrate and a patterned resist film has been defined on the silicon dioxide film.

Next, in Step SA2, a fluorocarbon gas with a C/F ratio of 0.5 or more, e.g., $C_5F_8$ gas, is introduced into the reaction chamber 10. In this embodiment, the gas pressure is controlled at a value between 0.665 and 3.99 Pa, e.g., 1.33 Pa.

Then, in Step SA3, the flow rate of the gas is controlled using the mass flow controller 15 such that the residence time τ becomes greater than 0.1 sec and equal to or less than 1 sec in accordance with the equation τ=P×V/Q, where τ is the residence time (unit: sec) of the gas in the reaction chamber, P is a pressure (unit: Pa) of the gas, V is a volume (unit: L) of the reaction chamber and Q is a flow rate (unit: Pa·L/sec) of the gas.

Subsequently, in Step SA4, the first RF power is applied from the first RF power supply 13 to the induction coil 12, thereby creating plasma from the fluorocarbon gas, e.g., $C_5F_8$ gas. In this case, if the flow rate of the gas is controlled such that the residence time τ becomes greater than 0.1 sec and equal to or less than 1 sec, then $E = P \times W_0 / Q$, which is the product of a power density Pi of the first RF power applied to create the plasma and the residence time τ, will be automatically controlled at a value greater than $0.8 \times 10^4$ sec·W/m³ and equal to or less than $8 \times 10^4$ sec·W/m³. The power density Pi is given by $W_0/V$, where $W_0$ is a magnitude (unit: W) of the power and V is the volume (unit: L) of the reaction chamber.

Thereafter, in Step SA5, the second RF power is applied from the second RF power supply 22 to the sample stage 20, thereby getting the created plasma attracted to the semiconductor substrate on the sample stage 20. Finally, in Step SA6, the silicon dioxide film is plasma-etched using the resist film as a mask.

According to the first embodiment, the residence time τ of the perfluorocarbon gas in the reaction chamber is set greater than 0.1 sec and equal to or less than 1 sec, and $E=P \times W_0/Q$, which is the product of the power density Pi of the first RF power and the residence time τ, is set greater than $0.8 \times 10^4$ sec·W/m$^3$ and equal to or less than $8 \times 10^4$ sec·W/m$^3$. Thus, the selectivity of the silicon dioxide film to the resist film can be increased to two or more.

Embodiment 2

Figure 10:
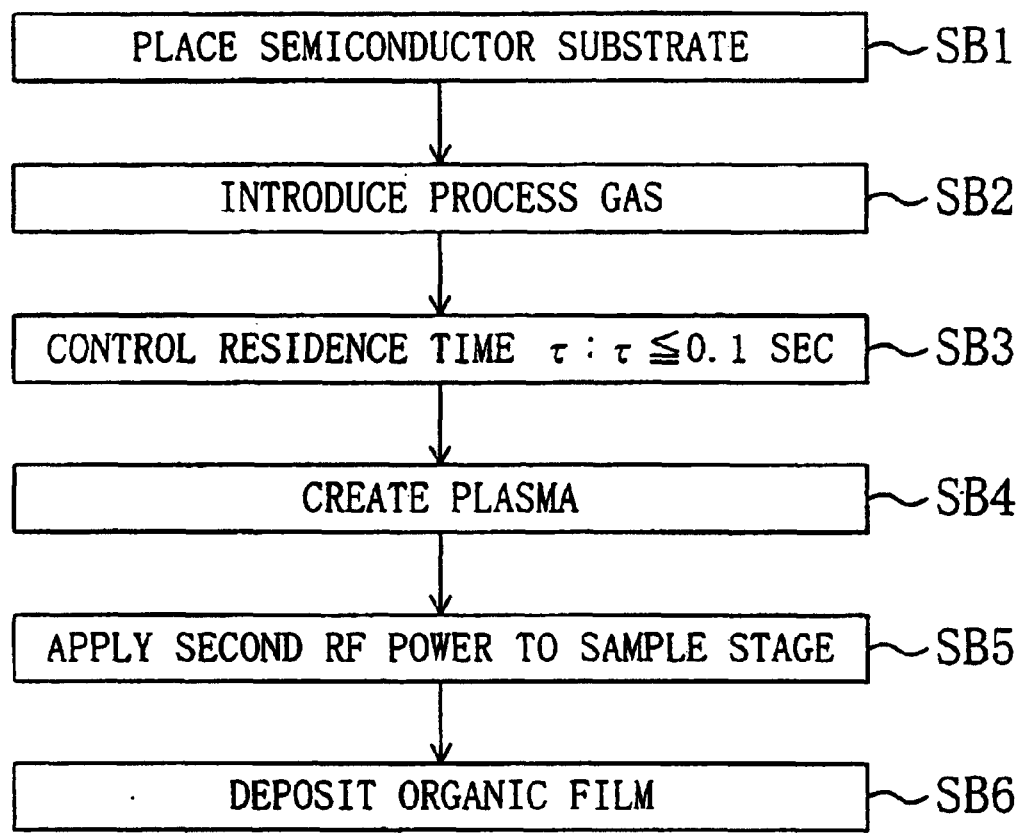
FIG. 10 is a flowchart illustrating a plasma processing method according to a second embodiment.

Hereinafter, a plasma processing method according to a second embodiment will be described with reference to FIGS. 1 and 10.

First, in Step SB1, a semiconductor substrate is loaded into the reaction chamber 10 of the plasma processing system and placed on the sample stage 20.

Next, in Step SB2, a fluorocarbon gas with a C/F ratio of 0.5 or more, e.g., $C_5F_8$ gas, is introduced into the reaction chamber 10. In this embodiment, the gas pressure is controlled at a value between 0.665 and 3.99 Pa, e.g., 1.33 Pa.

Then, in Step SB3, the flow rate of the gas is controlled using the mass flow controller 15 such that the residence time τ becomes 0.1 sec or less in accordance with the equation $\tau = P \times V/Q$.

Subsequently, in Step SB4, the first RF power is applied from the first RF power supply 13 to the induction coil 12, thereby creating plasma from the fluorocarbon gas, e.g., $C_5F_8$ gas. In this case, if the flow rate of the gas is controlled such that the residence time τ becomes 0.1 sec or less, then $E=P \times W_0/Q$, which is the product of a power density Pi of the first RF power applied to create the plasma and the residence time τ, will be automatically controlled at $0.8 \times 10^4$ sec·W/m$^3$ or less.

Thereafter, in Step S85, the second RF power is applied from the second RF power supply 22 to the sample stage 20, thereby getting the created plasma attracted to the semiconductor substrate on the sample stage 20. Finally, in Step SA6, an organic film is deposited on the semiconductor substrate.

According to the second embodiment, the residence time τ of the perfluorocarbon gas in the reaction chamber is set at 0.1 sec or less and $E=P \times W_0/Q$, which is the product of the power density Pi of the first RF power and the residence time τ, is set at $0.8 \times 10^4$ sec·W/m$^3$ or less. Thus, an organic film can be formed at a high deposition rate.

Embodiment 3

Figure 11:
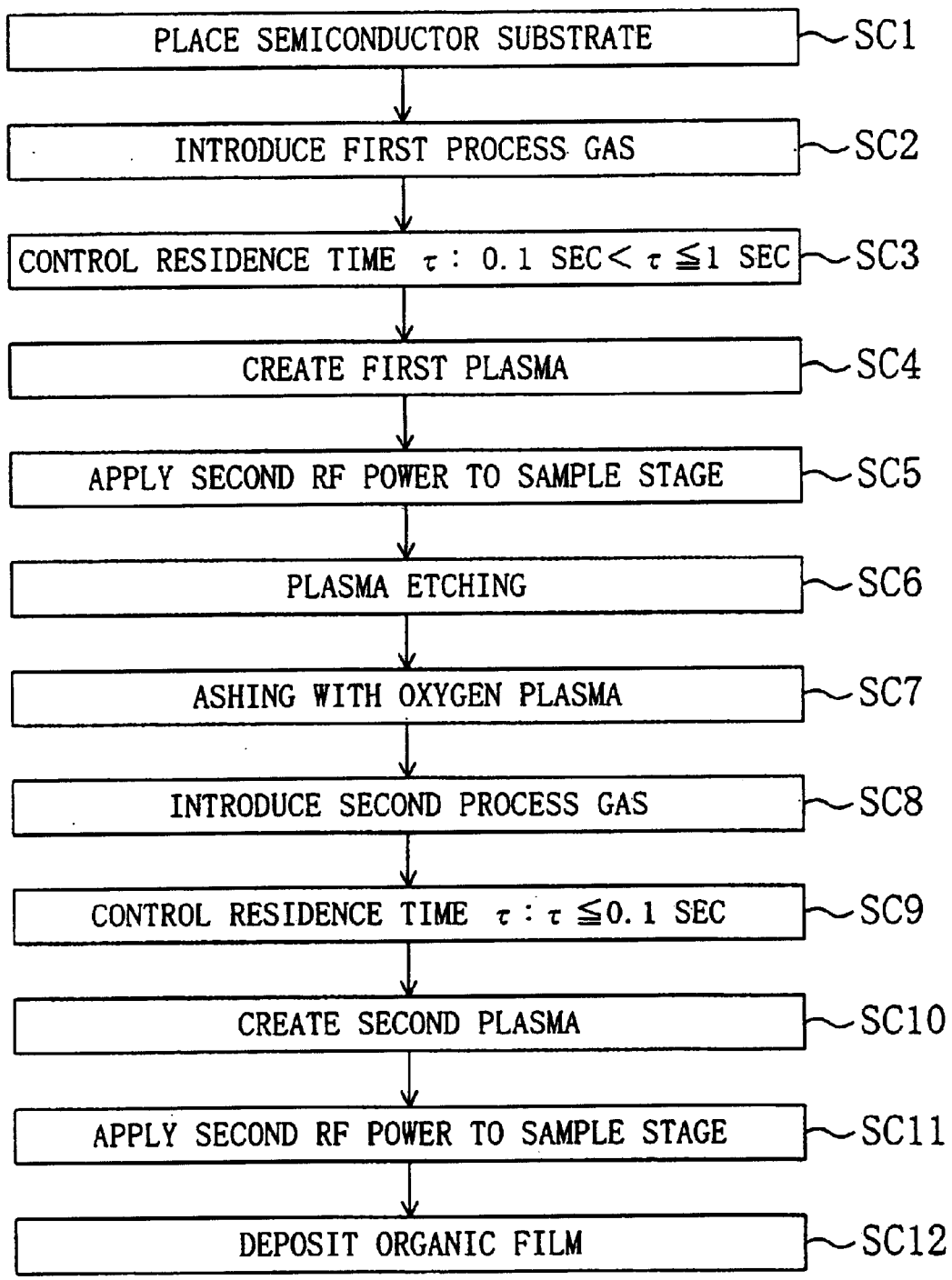
FIG. 11 is a flowchart illustrating a plasma processing method according to a third embodiment.

Hereinafter, a plasma processing method according to a third embodiment will be described with reference to FIGS. 1 and 11.

First, in Step SC1, a semiconductor substrate is loaded into the reaction chamber 10 of the plasma processing system and placed on the sample stage 20.

Next, in Step SC2, a first fluorocarbon gas with a C/F ratio of 0.5 or more, e.g., $C_5F_8$ gas, is introduced into the reaction chamber 10. In this embodiment, the gas pressure is controlled at a value between 0.665 and 3.99 Pa, e.g., 1.33 Pa.

Then, in Step SC3, the flow rate of the first gas is controlled using the mass flow controller 15 such that the residence time τ becomes greater than 0.1 sec and equal to or less than 1 sec in accordance with the equation $\tau = P \times V/Q$.

Subsequently, in Step SC4, the first RF power is applied from the first RF power supply 13 to the induction coil 12, thereby creating first plasma from the first fluorocarbon gas, e.g., $C_5F_8$ gas. In this case, if the flow rate of the first gas is controlled such that the residence time τ becomes greater than 0.1 sec and equal to or less than 1 sec, then $E=P \times W_0/Q$, which is the product of a power density Pi of the first RF power applied to create the first plasma and the residence time τ, will be automatically controlled at a value greater than $0.8 \times 10^4$ sec·W/m$^3$ and equal to or less than $8 \times 10^4$ sec·W/m$^3$.

Thereafter, in Step SC5, the second RF power is applied from the second RF power supply 22 to the sample stage 20, thereby getting the first plasma attracted to the semiconductor substrate on the sample stage 20. Next, in Step SC6, a silicon dioxide film is plasma-etched using a resist film as a mask.

When the plasma etching ends, the supply of the first perfluorocarbon gas is stopped and then oxygen gas is introduced into the reaction chamber 10 in Step SC7 to create oxygen plasma from the oxygen gas. In this manner, the resist film on the silicon dioxide film is ashed away.

Next, in Step SC8, a second fluorocarbon gas with a C/F ratio of 0.5 or more, e.g., $C_5F_8$ gas, is introduced into the reaction chamber 10. In this embodiment, the gas pressure is controlled at a value between 0.665 and 3.99 Pa, e.g., 1.33 Pa.

Then, in Step SC9, the flow rate of the second gas is controlled using the mass flow controller 15 such that the residence time τ becomes 0.1 sec or less in accordance with the equation $\tau = P \times V/Q$.

Subsequently, in Step SC10, the first RF power is applied from the first RF power supply 13 to the induction coil 12, thereby creating plasma from the second fluorocarbon gas, e.g., $C_5F_8$ gas. In this case, if the flow rate of the second gas is controlled such that the residence time τ of the gas becomes 0.1 sec or less, then $E=P \times W_0/Q$, which is the product of a power density Pi of the first RF power applied to create the second plasma and the residence time τ, will be automatically controlled at $0.8 \times 10^4$ sec·W/m$^3$ or less.

Thereafter, in Step SC11, the second RF power is applied from the second RF power supply 22 to the sample stage 20, thereby getting the created plasma attracted to the semiconductor substrate on the sample stage 20. Finally, in Step SC12, an organic film is deposited on the silicon dioxide film.

In the first through third embodiments, $C_5F_8$ gas is used by itself as the fluorocarbon gas. Alternatively, $C_4F_8$, $C_4F_6$, $C_3F_8$ or $C_6F_6$ gas may be used by itself or a mixture thereof may also be used.

In the third embodiment, the same gas is used as the first and second fluorocarbon gases. However, the first and second fluorocarbon gases may be either the same or different from each other.

Also, in the first through third embodiments, an inductively coupled plasma processing system is used as an exemplary plasma processing system. Alternatively, an ECR plasma processing system or surface wave excited plasma processing system may also be used.

Furthermore, in the first through third embodiments, the flow rate of the gas is controlled using the mass flow controller 15. However, the flow rate is controllable using the mass flow controller 15 and/or the pressure control valve 18 and the exhaust pump 19. Moreover, the flow rate of the fluorocarbon gas may also be controlled not only by making the process gas with inert gas, nitrogen gas, carbon monoxide gas or carbon dioxide gas but also by adjusting the flow rates of these gases.

What is claimed is:

1. A plasma processing method comprising the steps of:

placing a substrate inside a reaction chamber of a plasma processing system, a silicon oxide film and a resist pattern having been formed in order on the surface of the substrate;

introducing an etching gas composed of a fluorocarbon gas into the reaction chamber, the fluorocarbon gas includes carbon and fluorine, and C/F is 0.5 or more; and creating a plasma from the etching gas and etching the silicon oxide film with the plasma and using the resist pattern as a mask, wherein a residence time $\tau$ of the fluorocarbon gas in the reaction chamber is controlled at a value greater than 0.1 sec and equal to or less than 1 sec, so that the selectivity of the etching rate of the silicon oxide film with respect to the etching rate of the resist pattern is 2 or more the residence time $\tau$ being given by $P \times V/Q$, where P is a pressure (unit: Pa) of the fluorocarbon gas, V is a volume (unit: L) of the reaction chamber and Q is a flow rate (unit: Pa·L/sec) of the fluorocarbon gas.

2. The plasma processing method of claim 1, wherein the residence time $\tau$ is controlled by a mass flow controller provided for the plasma processing system and/or a valve and a pump provided for the plasma processing system.

3. A plasma processing method comprising the steps of:

placing a substrate inside a reaction chamber of a plasma processing system, a silicon oxide film having been formed on the surface of the substrate;

introducing an etching gas composed of a fluorocarbon gas into the reaction chamber, the fluorocarbon gas includes carbon and fluorine, and C/F is 0.5 or more; and creating a plasma from the etching gas and etching the silicon oxide film with the plasma and using the resist pattern as a mask, wherein a parameter $E=P \times W_0/Q$ (P is a pressure (unit: Pa) of the fluorocarbon gas, $W_0$ is a flow rate (unit: Pa·L/sec) of the fluorocarbon gas) is controlled at a value greater than $0.8 \times 10^4$ sec·W/m$^3$ and equal to or less than $8 \times 10^4$ sec·W/m$^3$, so that the selectivity of the etching rate of the silicon oxide film with respect to the etching rate of the resist pattern is 2 or more, without considering the volume of the reaction chamber in the plasma processing system.

4. The plasma processing method of claim 3, wherein the parameter E is controlled by a mass flow controller provided for the plasma processing system and/or a valve and a pump provided for the plasma processing system.

5. A plasma processing method comprising the steps placing a substrate inside a reaction chamber of a plasma processing system;

introducing a fluorocarbon gas into the reaction chamber, the fluorocarbon gas includes carbon and fluorine, and C/F is 0.5 or more; and creating a plasma from the fluorocarbon gas and depositing an organic film on the substrate using the plasma, wherein a parameter $E=P \times W_0/Q$ (P is a pressure (unit: Pa) of the fluorocarbon gas, $W_0$ is a magnitude (unit: W) of the power applied to create the plasma and Q is a flow rate (unit: Pa·L/sec) of the fluorocarbon gas) is controlled at $0.8 \times 10^4$ sec·W/m$^3$ or less, without considering the volume of the reaction chamber in the plasma processing system.

6. The plasma processing method of claim 5, wherein the residence time $\tau$ is controlled by a mass flow controller provided for the plasma processing system and/or a valve and a pump provided for the plasma processing system.

7. A plasma processing method comprising the steps of:

placing a substrate inside a reaction chamber of a plasma processing system, a silicon oxide film having been formed on the surface of the substrate;

introducing a first fluorocarbon gas into the reaction chamber, the first fluorocarbon gas includes carbon and fluorine, and C/F is 0.5 or more;

creating a first plasma from the first fluorocarbon gas and etching the silicon oxide film with the first plasma;

introducing a second fluorocarbon gas into the reaction chamber, the second fluorocarbon gas includes carbon and fluorine, and C/F is 0.5 or more; and creating a second plasma from the second fluorocarbon gas and depositing an organic film on the silicon oxide film with the second plasma, wherein a residence time $\tau$ of the first fluorocarbon gas in the reaction chamber is controlled at a value greater than 0.1 sec and equal to or less than 1 sec, the residence time $\tau$ being given $P \times V/Q$, where P is a pressure (unit: Pa) of the first fluorocarbon gas, V is a volume (unit: L) of the reaction chamber and Q is a flow rate (unit: Pa·L/sec) of the first fluorocarbon gas; and wherein a residence time $\tau$ of the second fluorocarbon gas in the reaction chamber is controlled at a value equal to or less than 0.1 sec, the residence time t being given by $P \times V/Q$.

8. The plasma processing method of claim 7, wherein the parameter E is controlled by a mass flow controller provided for the plasma processing system and/or a valve and a pump provided for the plasma processing system.

* * * * *

UNITED STATES PATENT AND TRADEMARK OFFICE
CERTIFICATE OF CORRECTION

PATENT NO. : 6,749,763 B1
DATED : June 15, 2004
INVENTOR(S) : Shinichi Imai

It is certified that error appears in the above-identified patent and that said Letters Patent is hereby corrected as shown below:

<u>Column 15,</u>
Line 21, please remove "more the" and replace with -- more, the --

Signed and Sealed this

Twenty-sixth Day of April, 2005

JON W. DUDAS
*Director of the United States Patent and Trademark Office*